United States Patent [19]

Berger et al.

[11] 4,053,777

[45] Oct. 11, 1977

[54] ACCIDENT- AND TAMPERING-PROOF ATTACHMENT MEANS OF AN OBJECT TO A STATIONARY SUPPORT

[75] Inventors: Heinz Otto Berger, Neuss; Wolfgang Münstedt, Cologne, both of Germany

[73] Assignee: GEBA, Gesellschaft fuer elektronische Brandmeldeanlagen mbH & Co., Neuss, Germany

[21] Appl. No.: 723,337

[22] Filed: Sept. 15, 1976

[30] Foreign Application Priority Data

July 7, 1976  Germany .............................. 2630572
July 7, 1976  Germany .............................. 7621503

[51] Int. Cl.² .............................................. G01T 1/18
[52] U.S. Cl. .................. 250/380; 24/221 K; 292/62; 250/374
[58] Field of Search .................... 250/380; 292/62; 24/221 K; 340/237 S

[56] References Cited

U.S. PATENT DOCUMENTS

| 2,564,101 | 8/1951 | Dzus | 24/204 |
| 3,600,018 | 8/1971 | Dzus | 292/62 |
| 3,767,917 | 10/1973 | Lampart et al. | 250/384 |
| 3,898,716 | 8/1972 | Aylott | 24/221 K |
| 3,985,453 | 10/1976 | Nakano | 340/237 S |

*Primary Examiner*—Harold A. Dixon
*Attorney, Agent, or Firm*—Otto John Munz

[57] ABSTRACT

A shock-, vibrations- and tampering-proof attachment means of an object, such as a signal producing insert of an ionization alarm system coaxially and non-rotatably to a support, such as for land-, marine- and air vehicles provides a spring assembly with a spring and biased coaxial protrusion in the bottom of the object with a helically wound canal running through the protrusion having end orifices in its surface. The support is provided with a U-shaped fork fixed with its yoke in it. A connecting means equipped with a rod traverses the protrusion perpendicularly to its axis. The rod is fastened to both free ends of the yoke. Optimum shapes and dimensions of the respective parts are established, also with the view of maintaining a minimum size of the object itself. The object with the fixed protrusion is mounted by rotation thereof to the support, thus hiding the attachment means and making them vibration proof and inaccessible from the outside. An attempt to disassemble the attachment by re-rotation of the object relative to the support results only firstly in moving the point of engagement of the attachment upwardly toward the vertex of the canal, simultaneously distancing the protrusion from the spring assembly and subsequently reversing the axial motion of the protrusion toward the spring assembly with the point of engagement of the attachment continuing to move to the end of the canal or channel, thus preventing axial separation and a reverse rotation without excessive force.

5 Claims, 7 Drawing Figures

ACCIDENT- AND TAMPERING-PROOF ATTACHMENT MEANS OF AN OBJECT TO A STATIONARY SUPPORT

The present invention is based on a copending related patent application of the same assignee, filed on Sept. 3, 1976 for: ATTACHMENT MEANS OF AN OBJECT TO A SUPPORT, by HARTWIG BEYERSDORF, Ser. No. 720,421 and discloses alternative embodiments and improvements thereover.

FIELD OF THE INVENTION

The invention relates to an attachment means specifically of an ionization alarm system to a shock-, vibrating- or tampering-prone fire alarm system.

DESCRIPTION OF THE PRIOR ART

U.S. Pat. No. 3,935,465, issued Jan. 27, 1976, for: AN IONIZATION ANALYZING AIR POLLUTION; SMOKE AND FIRE ALARM DEVICE, and 3,963,929, issued June 15, 1976, for: ANALYZING AIR POLLUTION, SMOKE AND FIRE ALARM DEVICE, each by HARTWIG BEYERSDORF, are made of record.

Means for attachment of a signal insert on to a base is known. They deal with a protrusion in the shape of a plug, and a connecting element provided within the base having at least one spring which rests against the enlarged end of a related plug and can be interlocked with it. This solution has the advantage of a most simple mechanical structure, but is in some cases of usage insufficient for the secure attachment of the insert to the base, for instance where the attached object is subject to axial oscillation in the case of boats, of machines or of buildings which are subject to vibration, or whenever a protection against unauthorized removal is necessary.

U.S. Pat. No. 2,564,101 discloses connecting devices for the fastening of an object to a support, which have a spring assembly, which can be fixed within the object, and which has a protrusion towards the support, and a connecting element attachable to the support. In the assembly the protrusion is held under directional spring tension away from the connecting element and is guided longitudinally so as to permit its abutment against a stop. In this device, the protrusion is provided with a channel the opening of which begins in the outside cylindrical surface of the protrusion at the free end of the protrusion, runs in an at least approximately helical line up to a vertex at a distance from the free end, and descends from there still maintaining the rotational sense of the helix, towards the free end, in a path that is axially shorter than the axial distance between the free end and the vertex, and the connecting element which is held in the support is adapted to reach radially into the channel. Furthermore, the end of the protrusion abutting against the stop within the spring assembly has a slot in the manner of a slotted head screw. The protrusion may be pushed axially against the spring tension with a screwdriver reaching through the open end of the spring assembly until it reaches into the fastening element of the support, and then can be turned, thereby effecting a bayonet catch between the protrusion and the fastening element.

By this means of attachment simultaneously the outside of its movable part is accessible to a screwdriver, in order to make the connection or to disassemble it if necessary. A covered attachment therefore is impossible.

SUMMARY OF THE INVENTION

The primary object of the invention is to provide a secured connection means between an object such as a signal insert of an ionization fire alarm system, and a support coaxially fastened to it, which will survive high axial shock oscillations and vibrations, such as in engine driven vehicles, or unauthorized or accidental tampering therewith.

Another object of the invention is to provide a rotatable assembly of the object with the support.

Another object of the invention is to mount the means of attachment described, hidden covered between the object and the support inaccessibly eliminating a disengagement thereof.

Yet another object of the invention is to provide the means of attachment mentioned which avoid the necessity of axial motion between parts of the object and support and of using a tool such as a screwdriver for the assembly thereof.

Other objects and advantages of the invention will become obvious to those skilled in the art from the following description, claims and drawings.

BRIEF DESCRIPTION OF THE DRAWINGS

FIG. 1 is an axial cross-sectional view of an ionization fire alarm signal device whose signal insert is attached to a base;

FIG. 2 is an enlarged detail of what is shown on FIG. 1;

FIG. 3 is a rear view of the signal insert of the fire alarm device shown in FIG. 1; and FIG. 4 is an axial section through a temperature alarm device, whose signal insert, according to the related invention, is fastened to a base.

FIG. 5 is a modification of the spring assembly of the alarm device of FIG. 1 or 4, in a presentation corresponding to FIG. 2;

FIG. 6 is a section through the spring assembly along line VI—VI in FIG. 5;

FIG. 7 is a rear view of the signal insert of the alarm device.

The same reference numerals denote the same or equivalent parts throughout all figures.

DESCRIPTION OF THE AFOREMENTIONED RELATED PATENT APPLICATION

Figure 1:
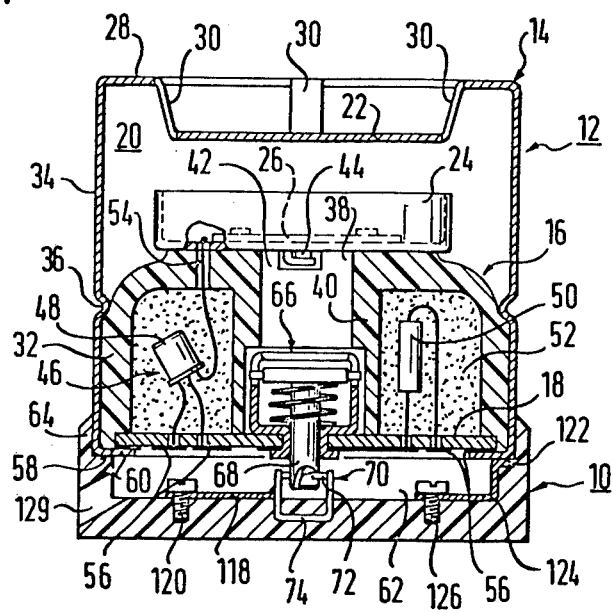
FIGS. 1 to 4 are views of a related invention filed on Sept. 3, 1976, for: ATTACHMENT MEANS OF AN OBJECT TO A SUPPORT, by HARTWIG BEYERSDORF.

In the device of the invention a proportion of the axial distance of the point of engagement of the connecting element fixed in the support from the point of stop to the distance between the free end of the protrusion from the point of stop, as measured when the protrusion abuts against the stop is provided to assure the engagement of the connecting element with the channel of the protrusion whenever the object touches the support surface. Axial motion of the protrusion by means of a screwdriver in order to achieve the connection is therefore not necessary.

In addition, the fact that the protrusion is fixed within the object so that it cannot be turned, permits turning of the protrusion in relation to the fastening element fixed in the support, by turning the entire object on the support. This is possible because the object is held in a turntable contact with the supporting surface. It is, therefore, not necessary either to use a screwdriver in order to turn the protrusion in relation to the connecting element fastened in the support, and, as a consequence, the protrusion can be hidden in a position behind the object, and does not require access to it from the front. The size of the object remains practically the same because a single spring assembly is centrally located. When the connecting element fixed in the support is in engagement with that part of the canal of the protrusion which runs in a helical line, a turning of the object, and thereby of the protrusion, achieves the effect that the point of engagement moves up to the vertex while simultaneously the protrusion is pulled from the spring assembly, after which the axial motion of the protrusion is reversed towards the spring assembly while the point of engagement continues to move as far as the end of the canal, thereby effecting a bayonet catch which effectively prevents axial separation of object and support as well as unintentional reverse turn, because a reverse turn would require sufficient torque to pull the protrusion out of the spring assembly again.

The signal insert 12 is provided with an outer metal housing 14, an insulator 16 retained within said housing, and a wiring plate 18 fastened to the insulator 16 on its rear surface, facing the base 10. A measuring chamber 20 is formed inside the housing 14, in which a plate-shaped outer electrode 22 and a center electrode 24 fastened to the outside of insulator 16, facing away from base 10 are mounted facing each other, and the measuring chamber is ionized by means of a radioactive source 26. The outside electrode 22 is axially spaced in a small distance from the annular front covering 28 by means of spacers 30, in such a way that, seen from the outside, it covers a circular cutout in the front covering 28, but so that the ambient air may enter the measuring chamber 20 between the front covering 28 and the outside electrode 22, practically unimpaired by the narrow spacers 30.

The cuplike insulator 16 which carries the center electrode 24, and which is open towards the base 10, has a cup-shaped outer wall 32, which is slipped into the tubular outer wall 34 of the metal housing 14, and is fixed therein. The axial position of insulator 16 and, therefore, the position of the center electrode 24 in relation to the outside electrode 22 is determined by a circular crimp 36 in the outside wall 34 of the metal housing 14. In the center of the outer wall 34 of insulator 16 is provided an opening 38, and from the rim of said opening 38, a tubular inner wall 40 of the insulator 16 reaches at least approximately to the level of the rim of the outside wall 32, facing the base, and surrounds an inner chamber 42. Part of the axial length of this inner chamber 42 serves as a reference ionization chamber, which is ionized by an additional radioactive source 44.

When smoke enters the measuring chamber 20, its resistance and thereby the ionization current flowing therein change. Thereby, the potential of the center electrode 24 changes, which can be used, in a manner known per se, to produce a fire alarm signal. For the utilization of the potential modifications of the center electrode 24, a signal transmitter circuit 46 is provided, which comprises a number of electrical circuit elements, such as a field effect transistor 48, and a resistor 50, and which are arranged in the annular space between outer wall 32 and inner wall 40 of the insulator 16. These circuit elements are imbedded in cast resin 52. The gate connection of the field effect transistor 48 which forms the input of the signal transmitter circuit 46, is led through a canal 54 in the outer wall 32 of the insulator 16, to the center electrode 24, with which it is connected, while the electrical connections between the electrical circuit elements 48, 50 of the signal transmitter circuit 46 are effected by conductors 56, shown in heavier print for the sake of clarity; which conductors are provided as a printed circuit on the wiring plate 18 on the rear side facing the base 10.

Base 10 is provided with an annular stationary supporting surface 58 for insert 12, which is seated on said supporting surface in a turnable manner. The housing 14 made of sheet metal is radially crimped towards the center to form an annular rim 60 on the rear of insert 12, which faces base 10, and which rests against the annular supporting surface 58. The crimping of the rim 60 takes place during the manufacture of the signal insert 12 after the introduction of the insulator 16, and the wiring plate 18 into the housing 14. The annular rim 60 abuts against the outer rim of the rear side of wiring plate 18, which faces base 10, thereby preventing axial motion of the wiring plate out of housing 14. The rim 60, when pressed with sufficient force against the rear side of the wiring plate 18, or bent into an opening provided in the wiring plate may be used in the prevention of a turning of the wiring plate 18 in relation to the housing 14 and the insulator 16.

The base or support 10 is further provided with an inner chamber 62 located axially behind the supporting surface 58, and with an axially protruding rim 64 which surrounds the supporting surface 58 and guides the axially rearmost portion of the cylindrical outside wall 34 of housing 14, and thereby the insert 12, in an axial direction, i.e. preventing a radial motion out of co-axial alignment with the base 10. The axial elevation of the rim 64 above the supporting surface 58 is less than the axial height of base 10 measured between its rear side facing away from insert 12 and the supporting surface 58, and the total height of base 10 is small compared to that of insert 12, so that the size of the entire alarm device is insignificantly enlarged by the base 10. The positioning of the supporting surface 58 close to the outer circumference of the base 10 permits a relatively minor radial width of the supporting surface 58, so that it practically does not encroach upon the space of the inner chamber 62 of base 10.

To connect the insert and the base, a spring assembly 66 is provided, which carries a cylindrical pin-shaped protrusion 68, projecting from the center of the rear side of insert 12, while within the base there is held a connecting element 70 in a non-turnable position.

The connecting element 70 comprises a rod 72 which traverses the protrusion 68 transversely to its axis, and which is slightly longer than the diameter of the protrusion 68, as well as of a U-shaped fork 74, which is cast into the base 10 with its yoke part, and to both free ends of which the rod 72 is fastened.

Figure 2:
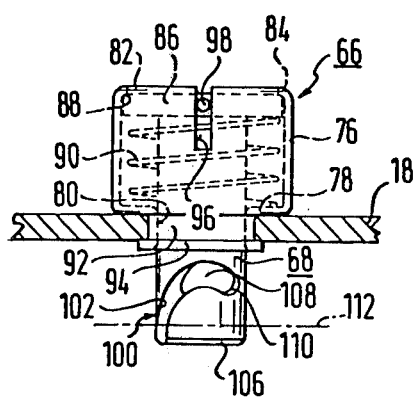
Figure 3:
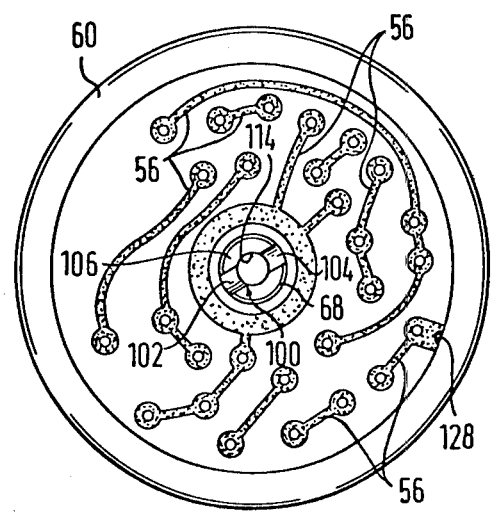

Spring assembly 66 and protrusion 68 are shown in greater detail on FIG. 2; a top view of the frontal surface of the protrusion 68 facing base 10 (FIG. 1) can be seen on FIG. 3.

The spring assembly 66 is nearly cup-shaped with a cylindrical outside wall 76, and a bottom 78, which is located at the frontal surface of the spring assembly 66 which faces base 10 (FIG. 1) and which abuts against the upper surface of the wiring plate 18, which faces away from the base 10. The bottom 78 is provided with a central aperture 80, through which extends the protrusion 68.

It is also possible to guide the protrusion inside the aperture 80 movably in a longitudinal direction. On its frontal side, facing away from the base 10 (FIG. 1), the spring assembly 66 is provided with an aperture 82 which is smaller than the inner diameter of its outside wall 76, which aperture is surrounded by a rim 84, crimped towards the center. The end of the protrusion 68, located inside the spring assembly 66, has an enlarged head 86, whose outside diameter corresponds to the inner diameter of the outside wall 76 of the spring assembly 66, and with which the protrusion 68 is guided within the spring assembly 66 in a longitudinally movable manner. The enlarged head 86 is adapted to abut against a stop which is formed by the inside 88 of the rim 84 of the spring assembly 66, which surrounds the aperture 82. On the side which faces away from the stop 88, the head 86 is surrounded by a helical spring 90 which exerts pressure in the direction of the stop 88; the other end of the helical spring 90 rests on the bottom 78 of the spring assembly 66.

A tubular collar 92, which coaxially surrounds the protrusion 68 and which traverses the wiring plate 18, extends in axial direction from the inner edge of the central aperture 80 of the bottom 78 of the spring assembly 66. On the rear side of the wiring plate 18, facing the base 10, the collar is crimped towards the outside to form a ring 94, which clamps the inner rim of the wiring plate 18 to the bottom 78 of the spring assembly. Thereby, the spring assembly 66 and the wiring plate 18 are connected with each other in a nonturnable manner. The inner diameter of the collar 92 corresponds approximately to the outer diameter of that section of the protrusion 68 which traverses it, so that the protrusion is guided in a longitudinally movable manner along a greater axial distance than corresponds to the thickness of the bottom 78; this, together with the guidance by means of the head 86 results in a two-fold longitudinal guidance in the embodiment shown. In principle, a single longitudinal guidance would suffice, a double guidance, however, gives the advantage of greater accuracy and a more robust device.

Insert 68 must be held in a non-turnable position relative to the signal insert 12. In the embodiment, this is achieved in a simple way by guiding the protrusion 68 non-turnably within the spring assembly 66, which spring assembly itself, as mentioned before, is fastened to the wiring plate 18 in a rigid, non-turnable manner. The spring assembly 66 has two diametrically opposed axial slits 96 each radially receiving one radially extending cam 98 of the protrusion 68. These cams 98 are fixed on the outer rim of the head 86.

Aside from its head 86, the protrusion 68 is of basically cylindrical outer shape along its entire axial length. It is diametrically transversed by a canal 100. The canal 100 has openings 102, 104 (FIG. 3), which are located on opposite sides on the outside of the protrusion 68. These openings 102, 104, are axially symmetrical to each other. As can be seen from FIG. 3, the canal 100 opens into the frontal side of the free end 106 of the protrusion 68, which frontal side faces the base 10. As can be seen from the opening 102 in FIG. 2, this opening begins at the free end 106 of the protrusion 68, climbs at first at a steep and then at a decreasing angle in an approximately helical line up to a vertex 108 located at a distance from the free end 106, and finally returns to the end 110 of the canal 100 still maintaining the rotational direction of the helical line, in a path covering a smaller axial distance than that between the free end 106 and the vertex 108.

When the signal insert 12 is separated from the base 10 (FIG. 1), the head 86 (FIG. 2) of the protrusion 68 under the effect of the helical spring 90 abuts against the stop 88. Now, in order to attach insert 12 to the base 10, the insert 12 is pushed into the base 10. Even though the protrusion 68 has been moved before as far as possible into the spring assembly 66, its length is sufficient that the rod 72 of the connecting element 70 provided in the base 10 can enter the opening of the canal 100, which begins at the free end 106.

A dash-and-dot line 112 in FIG. 2 indicates the point of catch of the rod 72 with the protrusion 68 and the spring assembly 66 when the ring 60 of the insert 12 abuts against the supporting surface 58. It is possible that at first the free end 106 of the protrusion 68 will meet the rod 72. By turning of the insert 12, however, it can be ascertained that the rod 72 actually can penetrate into the beginning of the opening of the canal 100 as far as to the point of catch 112. To this end, the axial distance between the point of catch 112 and the stop 88 is smaller than the distance measured between the free end 106 of the protrusion 68 from this stop 88, when the protrusion 68 abuts against this stop 88.

When the insert 12 is pushed into the base 10, the insert 12 should preferably be guided by the rim 64 of the base 10 already when the free end 106 of the protrusion 68 could possibly meet the rod 72. To this end, preferably the axial height of the rim 64 above the supporting surface 58 should be greater than the distance between the free end 106 of the protrusion 68 and the stop 88 when this protrusion 68 abuts against the stop 88, decreased by the axial distance measured in the same position between the surface of the insert 12 which is intended to abut against the support 58 of the base 10, i.e. the rear side of ring 60 which faces base 10, and stop 88. It is particularly important that the insert 12 be guided within the rim 64 while the rod 72 penetrates the opening of the canal 100, for which purpose the axial height of the rim 64 above the supporting surface 58 should be greater than the distance of the free end 106 of the protrusion 68 measured from the stop 88 in a position of abutment of the protrusion 68 against the stop 88, decreased by the axial distance of the point of catch 112 of the connecting element 70 from the stop 88.

After the insert 12 has been pushed into the base 10 until the ring 60 abuts against the supporting surface 58 of the base 10 and the rod 72 has reached the point of catch 112 as indicated in FIG. 2, the insert 12 is rotated. In the embodiment, this rotation is clockwise, although, in principle, with an initial helical inclination of the canal 100 in the opposite direction, a fastening by counterclockwise rotation would also be possible. Because of the helical form of the canal 100, by the rotation of insert 12, and thereby of the protrusion 68, an axial relative movement between protrusion 68 and rod 72 is effected; in-deed, because of the rigid attachment of the rod 72, the protrusion 68 is axially pulled out of the spring assembly 66. This movement continues until the rod 72 penetrates the canal 100 at the vertex 108. Subsequently, while the sense of rotation of the insert 12 is maintained, the protrusion moves under the influence of the helical spring 90, back into the spring assembly 66, until the rod 72, as shown in FIG. 1, penetrates the canal 100 at its end 110. Thus, a bayonet catch is achieved, because a reverse rotation of the insert is possible only by overcoming not only the friction forces, but also the tension of the helical spring 90, in order to pull the protrusion 68 from the spring assembly 66 until it reaches the vertex 108 once more.

As a modification of the embodiment shown, the canal 100 simply is a groove with a single opening in the cylindrical surface of the protrusion 68, and the connecting element 70 provided in the base 10 is fashioned as a pin, which catches this groove radially from the outside. Further two such grooves in axially-symmetrical position are provided into which a pin each locks radially, in other words, two openings 102, 104 are provided similar to the embodiment shown, but which do not have a diametrically transversing canal. During the manufacture of the canal 100 as a transversing canal as shown in the embodiment, it is practical, if, as can be seen from FIG. 3, a central bore 114 is made in the protrusion 68, starting at the free end 106 thereof, and then the two halves of the canal 100 are milled into the opposite side of the protrusion 68, each thereby forming an opening 102, 104.

In the embodiment, the outside diameter of the housing 14 of the insert 12 as well as the total height of the signal device is 35 mm each; FIG. 1 shows the signal device in approximately two-fold enlargement. It is sufficient in this case if the spring assembly 66 has a diameter of 9 mm, and an axial height above the wiring plate 18 of 6.5 mm, while the protrusion 68 has a diameter of 5.5 mm, and extends 7 mm beyond the reverse side of the wiring plate 18 in the direction of the base 10. It is evident that the size of the signal insert 12 is actually not affected. In addition, the frontal side of the spring assembly 66, facing away from the base 10, together with the head 86 of the protrusion 68, enclosed therein, replace a required inner electrode of the reference chamber wired in series with the measuring chamber 68, which, in this manner is provided inside the axial space of the inner chamber 42, which is located between the rear side of the center electrode 24, and the spring assembly 66, which is effective as part of the inner electrode. The spring assembly 66, therefore, does not increase the size of an ionization fire alarm device of familiar construction.

The embodiment shown has an additional advantage over a known ionization fire alarm device, in that the head 86 of the protrusion 68, which forms part of the inner electrode, is axially movable by means of which the effective distance between the center electrode 24, and the inner electrode, can be adjusted. When the insert 12 is fastened to the base 10, the required axial position of the head 86 can be effected by, for instance, inserting at least one washer or washers of varying thicknesses between the ring 60 of the insert 12 and the supporting surface 58 of the base 10. A wide insulating distance between the center electrode 24 and the inner electrode is provided by the fact, that the inner dimensions of the inner wall 40 of the insulator 16 in the axial space, which contains the spring assembly 66, are greater than the outer diameter of the spring assembly so that the inner wall 40 surrounds the spring assembly 66 without touching it.

In order to ascertain that, whenever the protrusion 68 is pulled from the spring assembly 66, the forces needed to overcome the spring resistance can be transferred through the inner rim of the wiring plate to the rim 60, and the supporting surface 58, without bending the wiring plate 18, said wiring plate 18 should not only be fastened to the outside wall 32, but it also should be fixed to the rear end of the inner wall 40 of the insulator 16. This can be achieved by glueing for example. Additionally, a close mechanical connection between the insulator 16 and the wiring plate 18 is achieved by the casting compound 52 inside the annular space between inner wall 40 and outer wall 32 which compound is filled in through an opening (not shown) in the wiring plate 18 or in the outer wall 32 only after the wiring plate 18 has been applied to the rear side of the insulator 16. It is also possible, if necessary, to provide the rear end of the inner wall 14 of the insulator 16 with plug-shaped protrusions which extend through openings, which are not shown, in the wiring plate 18, and which are heat-molded to form heads resting against the rear side of the wiring plate facing the base 10. At the same time, the aforementioned steps ascertain that the rotational forces exerted by the protrusions 68 can be transferred to the insert 12 without damage to the wiring plate 18.

The electrical connection between the signal insert 12 and the base 10 is achieved by two pairs of contacts, one of which being formed by the protrusion 68 and the connecting element 70 provided in the base 10; the yoke 74 of the connecting element 70 is connected to a contact screw 120 by means of a metal strip 118. The second pair of contacts is formed by the rim 60 of the housing 14 and a contact 122 located within the supporting surface 58 of the base 10 and thereby being part of the supporting surface 58, and which is also connected to a contact screw 126 by means of a connection lug 124. If so desired, the contact 122 may be resilient in the axial direction. It preferably connects the entire electrically conductive housing 14 to ground or mass potential. If, as in an above mentioned case, a washer should be inserted between the annular rim 16 and the supporting surface 58, this washer should be made of electrically conductive material, or else have a cutout at the position of contact 122, so that it will not hinder the current flow between rim 60 and contact 122. Insofar as the signal transmitter circuit 46 needs a ground or mass connection like the housing 14, this connection can be provided by soldering to the rim 60 a conductor 56, onto which the rim 60 is bent, at a soldering point 128. A cable which is connected to the contact screws 120, 126 can be led into the base 10 through an opening 129.

Figure 4:
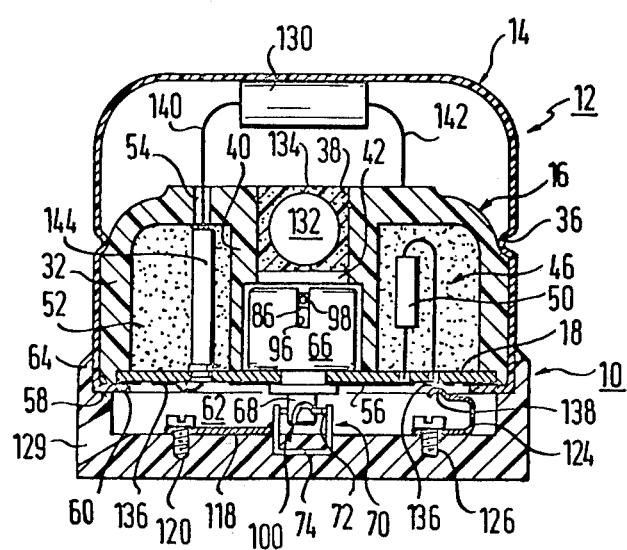

FIG. 4 shows, in another embodiment, the use of the means of attachment in a heat signal device. Identical or similar parts as shown in FIG. 1 to 3 are identified by identical reference numbers. The mechanical structure of the signal insert 12 and of the base 10 are closely similar to the aforementioned embodiment, and the connection by means of the spring assembly 66 and the protrusion 68 on the one hand, and the connecting element 70 on the other hand, is identical.

The heat signal device according to FIG. 4 consists of an efficiently heat-conducting, however electrically non-conductive housing 14 made of plastic which cups the insulator 16 at some distance on the side facing away from the base 10, a resistor 130, having a resistance value varying in response to the ambient temperature, and mounted in thermal contact with the inside of the housing 14 as well as a similar, however thermally insulated resistor 132 electrically connected in series with resistor 130. The thermally insulated resistor 132 is located inside the axial space of the inner chamber 42, which is not occupied by the spring assembly 66. Already by this location, the air which is trapped between housing 14 and the insulator 16, and which heats up but slowly, in turn protects the resistor 132 from heating up too quickly, so that very little else is necessary to effect thermal insulation. Preferably, to further this effect, the thermally insulated resistor 132 can be held inside the inner chamber 42 by a thermally insulating adhesive or cast resin layer 134 which surrounds resistor 132, and simultaneously serves as a means of attachment. It is further preferable to manufacture the insulator 16 from thermally insulating material. Because the axial height of the insulator 16 is approximately equal to the sum of the axial heights of the spring assembly 66, and the thermally insulated resistor 132, the axial height of construction is small. The use of an insulator 16 identical to that of the embodiment shown in FIG. 1 to 3 permits a multi-purpose use of this insulator.

The alarm signal circuit 46, electrically connected to the connecting point between the resistor 130 and the thermally insulated resistor 132 may have a different electrical structure than in the aforementioned embodiment, but again it is located in the annular space between inner wall 40 and outer wall 32 of the insulator 16, and the electric conductors 56 provided on the reverse side of the wiring plate 18 may have a different pattern from the aforementioned embodiment.

Again, one pair of contacts is formed by the protrusion 68 and the connecting element 70 provided in the base 10. Since the housing 14 is electrically non-conductive, the second pair of contacts consists of a conductor 136 and a contact 138 resiliently resting against that conductor. In order to permit a position of the insert 12 which is turned by an angle of 180° in relation to the position of the insert 12 to the base 10 as shown in the drawing, the conductor 136 may extend in a semi-circle or a circle around the axis of the signal insert 12. A particular position of the insert 12 may be enforced by the use of coded pins or other such enforcement means.

Of the connecting wires 140, 142 of the resistor 130, connecting wire 140 is guided, in a direction parallel to the axis, from the outside of the insulator 16, facing away from the base 10, through a channel 54 provided in its outer wall 32, through the space between inner wall 40 and outer wall 32 of the insulator 16, and through an opening in the wiring plate 18 to its reverse side, facing the base 10, and is soldered there to the conductor 136. Since the soldering can take place only after the resistor 130 has been connected to the housing 14, and the insulator 16 as well as the wiring plate 18 with the signal circuit 46 have been introduced into the housing 14, it is useful for the passage of the connecting wire 140 through the annular space between inner wall 40 and outer wall 32 of the insulator 16, and through the opening in the wiring plate 18, if, as in the embodiment, the connecting wire 140 is surrounded on approximately its entire length between the outer wall 32 of insulator 16 and wiring plate 18 by a sleeve 144, which is fastened at one of its ends, and serves as a guide for the connecting wire 140. In the embodiment, the sleeve 144 is held in the wiring plate 18. The same measure, which is not shown, may be provided for the connecting wire 142. The connecting wires of the thermally insulated resistor 132, which are not shown, may either be brought through the inner wall 40 of the insulator 16 towards the wiring plate 18, or else they might be led to the outside of the insulator 16, facing away from the base 10, and then may be guided from there in a similar manner as the connecting wire 140, axially parallel to the rear side of the wiring plate 18.

DESCRIPTION OF THE PRESENT INVENTION

Figures 5, 6, 7:
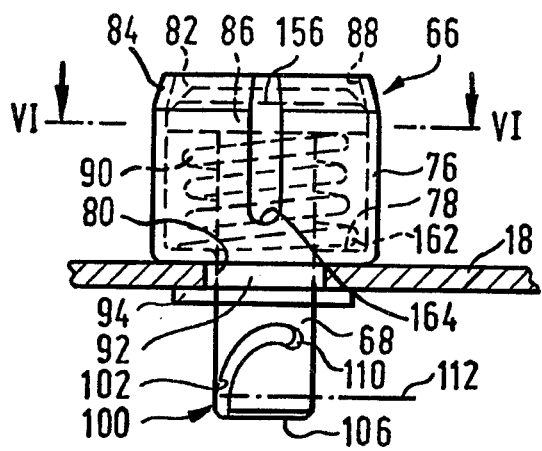
FIGS. 5 to 7 are based on the above described related patent application and show the improvements and modifications taught by the present application.

In accordance with FIGS. 5 and 6 the spring assembly 66 is substituted for that shown on FIGS. 1, 2, and 4. It is partially identical to the former embodiment; identical or similar parts are identified by identical reference characters.

In the embodiment shown in FIGS. 5 and 6, the spring assembly 66 has on its inside at least one, and in the embodiment presented, two indentations 150, 152 (FIG. 6) indented towards the center as compared to a circular cross section, each being formed by an inwardly directed crimping 154, 156, in the generally cylindrical outer wall 76. The head 86 is provided with recesses corresponding to the indentations 150, 152, in the form of milled grooves 158, 160. These, as well as the crimpings 154, 156, run in an axial direction, so that again a non-turnable guiding of the head 86 inside the spring assembly 66 is assured.

The helical spring 90 of the embodiment, in an axial portion adjoining the head 86, has an outside diameter approximately as large as twice the distance of an indentation 150 or 152 from the axis of the spring assembly, i.e. equal to the distance between the indentations 150, 152. The turn 162 of the helical spring 90 which abuts against the bottom 78 of the spring assembly 66, however, has a larger outside diameter. In order that this turn 162 cannot be caught between the indentations 150, 152, the crimpings 154, 156 extend from the rim 84 of the spring assembly 66 only along part of its axial height so that the lower ends of the crimpings 154, 156 are in an axial distance from the bottom 78, as can be seen for instance with the lower end 164 (FIG. 5), which distance is at least as great as the axial thickness of the larger turn 162. This then, if desired, may have an outside diameter which is approximately as large as twice the radius of the non-indented inner side of the spring assembly 66. By enlarging the turn 162 of the helical spring 90 in comparison to its other turns, a very secure abutment against the bottom 78, is assured, and a catching of the helical spring 90 between the indentations 150, 152 is avoided.

Departing from the embodiments shown, there could be provided one or more indentations of different shape. For instance, the head 86, instead of having a groove could be provided with a flat surface, and the outer wall 86 of the spring assembly 66 could be furnished with a straight facet to be adapted to cooperate with the flat surface. If several such straight facts are provided, a polygonal cross section of the spring assembly and a polygonal outline of the head 86 will finally result, which has the advantage to make it possible that the protrusion 68 with the head 86 can be made from a bolt, with, for instance, a hexagonal head. On the other hand, it is also possible to provide more than two crimpings 154, 156, the advantage being that the use of three or more crimpings would hold the helical spring 90 approximately centrally.

FIG. 7 shows further possibilities of modification. Even though conductors 56, shown in FIG. 3, of the signal device of FIG. 1 are shown, the modifications can also be applied to the signal device of FIG. 4 if the conductors are laid out in a suitingly modified manner. First, in FIG. 7 the collar 94 of the spring assembly 68 is enlarged as compared to the previously described embodiments. Further, indented notches 166 are pressed into this collar 94 from the rear side of the signal insert 12, which still improve the non-turnable connection of the spring assembly 66 (FIG. 2 or FIG. 5) with the wiring plate 18. In a minor deviation of this embodiment, the use of claws or other gripping connecting elements could be provided in the place of the indented notches, with which the ring 94 grips into the material of the wiring plate 18. In order to make it possible that these connecting elements may be sunk into the material of the wiring plate without excessive use of force, the latter should be manufactured from a ductile, elastic material, for instance a plastic reinforced with fiber glass.

As can be seen in a part of FIG. 7 where a portion of the annular rim 60 has been cut away, a further means to attach the outer rim of the wiring plate 18 with the outer wall of the insulator 16 in a non-turnable manner may be furnished by at least one cam 166 radially directed towards the center, which fits into an indentation 168 in the outer rim of the wiring plate 18. In this case, the wiring plate 18 is positioned within the outer wall 32 of the insulator 16 in such a way that its rear side, facing the base 10 is flush with the rear rim of the outer wall 32, as can also be seen from FIGS. 1 and 4. In this case, the cam 166 can join the outer wall 32 of the insulator 16 at the level of the top surface of the wiring plate 18 facing away from the base 10, which is not shown, but which will provide great mechanical stability of the cam.

What is claimed is:

1. A shock-, vibrations-, and tampering-proof attachment means of an object, such as a signal producing insert of an ionization alarm system coaxially along a common central axis to a fixed support face of a support, such as of land-, marine- and air-vehicles,
    A. said object comprising:
        A. 1. an elongated protrusion mounted nonrotatably and coaxially in the bottom of said object and protruding through its bottom downwardly facing said support face;
        A 2. a spring assembly mounted coaxially within the bottom of said object;
        A 3. a helical crescent shaped channel with openings within the protruding bottom of said protrusion said channel continuing with a vertex directed upwardly and from there to its end;
    B. said support provided with a connector means for a rod, said connector means fixed nonrotatably coaxially with said protrusion; said connector means protruding upwardly from said support;
    C. a rod mounted between the said connector means and reaching into said protrusion to engage said channel in a direction substantially radial to the common axis to permit assembly of said object with said support by rotation of the former relative to the latter, to prevent their separation by accident or design.
    said spring assembly comprising an axial helical spring and an upper stop, the protrusion being provided with a head, being mounted within said spring and pushed by it upwardly with the head against the stop away from the connecting element;
    the axial distance of the path between the openings within the protruding bottom of said protrusion from the vertex being greater than that from the vertex to the end of said channel;
    the axial distance between the point of engagement of said rod with said channel or point of catch of the connecting element held in the support, and the stop being smaller than the distance between the free end of the protrusion and the stop in the protrusion of abutment of the protrusion against the stop;
    the spring assembly being provided on its inner side with at least one indentation extending inwardly in deviation from a circular cross-section, and extending along at least part of the axial height of the spring assembly, and that the head being provided with milled grooves, corresponding to said at least one indentation.

2. An attachment means as claimed in claim 1, the at least one indentation being formed by an inwardly directed crimping provided in the outer wall of the spring assembly.

3. An attachment means as claimed in claim 1, the helical spring in an axial portion adjoining the head having an outer diameter which is smaller than, and preferably approximately equal to twice the distance of the indentation from the axis of the spring assembly.

4. An attachment means as claimed in claim 3, the said helical spring being provided with at least one turn resting against the bottom of the spring assembly, facing the base, having an outer diameter greater than the diameter of the helical spring in its axial portion adjoining the head, and preferably being approximately as wide as twice the radius of the non-indented inner side of the spring assembly;
    the indentation ending at an axial distance from the bottom which is at least as large as the axial thickness of the larger turn.

5. An attachment means as claimed in claim 1, the object being provided with an outside housing and an insulator, and on its rear side with a plate non-rotatably connected with the housing;
    the spring assembly being mounted non-rotatably on a surface of the plate on the side facing away from the base;
    the plate being positioned inside the outer wall of the insulator, the rear surface of the plate facing the base being preferably flush with the rear rim of the outer wall; the outer wall being provided with at least one cam, projecting radially inward to interlock with a notch in the outer rim of the plate.

* * * * *